United States Patent [19]

Chamberlain et al.

[11] 4,025,943
[45] May 24, 1977

[54] PHOTOGENERATION CHANNEL IN FRONT ILLUMINATED SOLID STATE SILICON IMAGING DEVICES

[75] Inventors: Savvas G. Chamberlain, Waterloo; David H. Harper, Kitchener, both of Canada

[73] Assignee: Canadian Patents and Development Limited, Ottawa, Canada

[22] Filed: Mar. 22, 1976

[21] Appl. No.: 669,406

[52] U.S. Cl. .................................. 357/30; 357/23; 357/24; 307/311
[51] Int. Cl.² ...................................... H01L 27/14
[58] Field of Search .................. 357/30, 24, 23; 307/311

[56] References Cited

UNITED STATES PATENTS

| | | | |
|---|---|---|---|
| 3,882,531 | 5/1975 | Michon | 357/24 |
| 3,887,936 | 6/1975 | Shannon | 357/30 |
| 3,894,295 | 8/1975 | Shannon | 357/19 |
| 3,906,543 | 9/1975 | Smith | 357/24 |
| 3,906,544 | 9/1975 | Engeler | 357/24 |
| 3,916,429 | 10/1975 | Kosteler | 357/31 |
| 3,964,083 | 8/1976 | Lohstroh | 357/30 |

*Primary Examiner*—Martin H. Edlow
*Attorney, Agent, or Firm*—Edward Rymek

[57] ABSTRACT

A silicon photoelement imager which includes a photogeneration channel consisting of a layer of doped semiconductor material, located on a support substrate having a layer of oppositely doped semiconductor material. The photogeneration channel, in which carriers are photogenerated, has an optimum effective thickness of $d/\pi$, where $d$ is the center to center spacing of the photoelements; while the support substrate is sufficiently thick to provide strength and rigidity to the device. The support substrate layer is further biased with respect to the photogeneration channel so as to drain and prevent any carriers produced in the support substrate from entering the photogeneration channel. This photogeneration channel substrate structure can be used to improve the spatial resolution of CCD and MOSFET imagers.

6 Claims, 5 Drawing Figures

PHOTOGENERATION CHANNEL IN FRONT ILLUMINATED SOLID STATE SILICON IMAGING DEVICES

This invention is directed to photoelement arrays for front illuminated solid state silicon imaging devices and in particular to a novel structure for improving the spatial resolution of linear or area photoelement arrays which are compatible with FET technology and can be used in conjunction with CCD shift registers or MOSFET shift registers to form solid-state self scanned charge-coupled (CCD) imagers or MOSFET imagers.

Conventional schemes for imagers are described in the references by J. E. Carnes — "Charge-coupled imaging: state of the art" — Solid States Devices, 1973, published by The Institute of Physics, London — pages 83 to 107; and by J. E. Carnes et al — "Charge-coupled devices and applications," Solid State Technology, April 1974, pages 67 to 77. Further, silicon photoelement arrays can be realized by using a p-n junction of the type discussed by S. G. Chamberlain in the publication "Photosensitivity and scanning of Silicon Image Detector Arrays," IEEE Journal of Solid-State Circuits, Vol. SC-4, No. 6, 1969, pages 333 to 343, or a polysilicon gate as the photoelement of the type discussed by R. W. Brown et al in the publication "Quantum Efficiency of a Silicon Charge Coupled Imaging Array," Physica Status Solidi (a), Dec. 1973, pages 675 to 685.

Loss of resolution in imagers is due to many factors in an imager system and can be analysed by looking at the various Modulation Transfer Function (MTF) components of the system:

$$MTF_{system} = MTF_{lens} \cdot MTF_{diffusion} \cdot MTF_{aperture} \cdot MTF_{transfer\ inefficiency} \cdot MTF_{amplifier} \qquad 1$$

Within the imager itself, MTF roll off occurs due to aperture sampling, transfer inefficiency and lateral diffusion.

Spatially modulated light incident upon a stationary photoelement array causes photogeneration of carriers, within the device semiconductor bulk, proportional to the intensity of incident light. Once generated, carriers with the semiconductor bulk diffuse toward the potential minima created by the photoelements at the semiconductor surface and also in the lateral direction, i.e. tangential to the semiconductor surface, due to the uneven lateral distribution of photogeneration carriers. This lateral diffusion of carriers causes loss of resolution which is particularly high in imagers having a high spatial frequency response, i.e. an imager having a high density of photoelements and wherein the spatial modulation wavelength is smaller than the carrier diffusion length which is the average distance a carrier can travel in a semiconductor before recombination occurs.

Carriers photogenerated within close proximity to the potential minima, i.e. a distance much less than the wavelength of spatial modulation, will readily diffuse into the potential minima, thus having little opportunity to diffuse laterally. On the other hand, carriers photogenerated, at distances far in excess of the spatial modulation wavelength from the potential minima, will diffuse laterally to the extent that modulation information is severely attenuated. This is normally the case since conventional imagers have a bulk semiconductor substrate which is thick relative to the wavelength of spatial modulation and carriers are generated deep within the substrate by the incident light.

To overcome this problem, it has been suggested in the publication "Carrier Diffusion Degradation of Modulation Transfer Function in Charge Coupled Devices" — D. H. Seib — IEEE Transactions on Electron Devices, Vol. ED-21, No. 3, March 1974, pages 210 to 217, that the CCD imager substrate be as thin as possible, preferably a thickness less than the smallest spatial wavelength of interest such as less than 15 $\mu$m. Carriers then photogenerated within the CCD imager substrate, would all be within close proximity to the potential minima. These carriers would readily diffuse into the potential minima before significant lateral diffusion occurred. However, such a CCD imager, due to the necessary thinness of the substrate, would be difficult to fabricate as it would be very fragile.

It is therefore an object of this invention to provide a photoelement array having an improved resolution.

It is a further object of this invention to provide a photoelement array having little lateral diffusion of photogenerated carriers.

It is another object of this invention to provide a photoelement array capable of a high spatial frequency response.

It is a further object of this invention to provide a photoelement array of sufficient structural strength for manufacture and handling.

It is another object of this invention to provide a photoelement array wherein the response to spatial modulation wavelength, which is smaller than the carrier diffusion length, is improved.

These and other objects are achieved in a photoelement array for imagers which includes a photogeneration channel in which carriers that are photogenerated by the incident light and on which an arrangement of photoelement means are positioned to provide discrete potential minima to collect the carriers, a substrate having a workable thickness which supports the photogeneration channel and means for preventing carriers photogenerated in the support substrate from entering the photogeneration channel. The effective thickness of the photogeneration channel is smaller than the spatial modulation wavelength from which the image is formed with the optimum thickness of the photogeneration channel being $d/\pi$, where $d$ is the center to center spacing of the photoelements. The means for preventing carriers in the support substrate from entering the photogeneration channel may be a voltage source connected so as to bias the photogeneration channel with respect to the support substrate.

In the drawings

Figure 1:
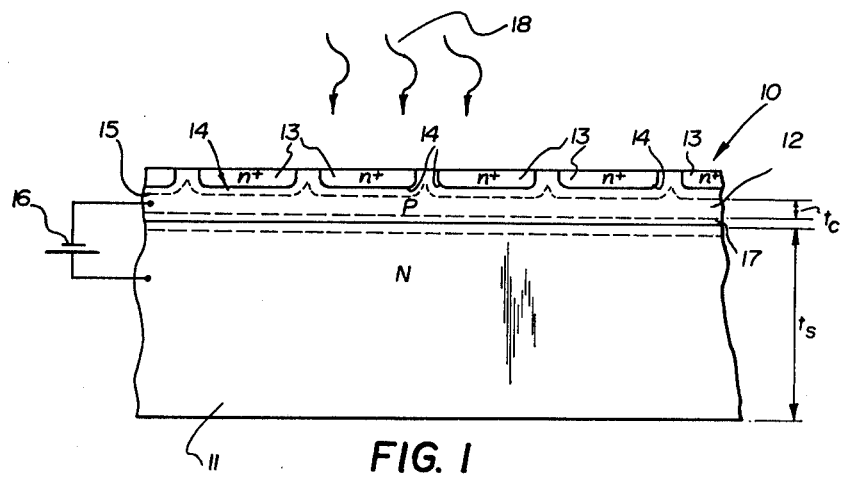
FIG. 1 illustrates a sectional view of the p-n junction photoelement array in accordance with this invention.

A section of p-n junction photoelement array 10 in accordance with this invention is described with respect to FIG. 1. The array 10 includes a support substrate 11 consisting of a layer of N-doped crystalline semiconductor material having thickness $t_s$ which is at least sufficient to provide structural strength and rigidity to the array 10; for most applications it would be sufficient that $t_s \geq 180\mu m$. A photogeneration channel 12 consisting of a layer of P-doped crystalline semiconductor material is located on the support substrate 11. Channel 12 may be epitaxially grown on substrate 11 or produced in any other conventional manner. The array 10 further includes $n^+$ regions 13 diffused within channel 12. These $n^+$ regions 13 form a series of p-n junction photoelements i.e., photosensors, having potential minima or collectors for electrons at the metallurgical junction 14. Broken line 15 shows the boundary of the potential minima depletion region in the channel 12 produced by the $n^+$ regions. The channel 12 is further reverse biased with respect to the substrate 11 by a voltage source 16 coupled between the channel 12 and the substrate 11 forming a further depletion region on either side of the metallurgical boundary between the substrate 11 and the channel 12, the boundary of the depletion region in the channel 12 is indicated by broken line 17. Channel 12 is made such that the effective thickness $t_c$ between the boundary 15 and the boundary 17, is smaller than the spatial modulation wavelength $d$ from which the image is formed and in particular, the optimum thickness $t_c$ has been determined to be $d/\pi$, where $d$ is the center to center spacing of the $n^+$ regions 13.

In operation, only the carriers which are produced in channel 12 by incident optical energy 18 penetrating the channel 12 will diffuse and be collected by the p-n junction photoelement which is closer to it. These carriers will not diffuse laterally. The carriers produced by the incident light 18 penetrating deep through the channel 12 will be drained out by the external bias 16 which prevents them from diffusing laterally to adjacent p-n junction photoelements and thus degrading the resolution of the photoelement array 10. In addition, it is to be noted that the effective thickness $t_c$ of the photogeneration channel may be varied by controlling the external bias 16 and thus shifting the depletion region boundary 17.

Figure 2:
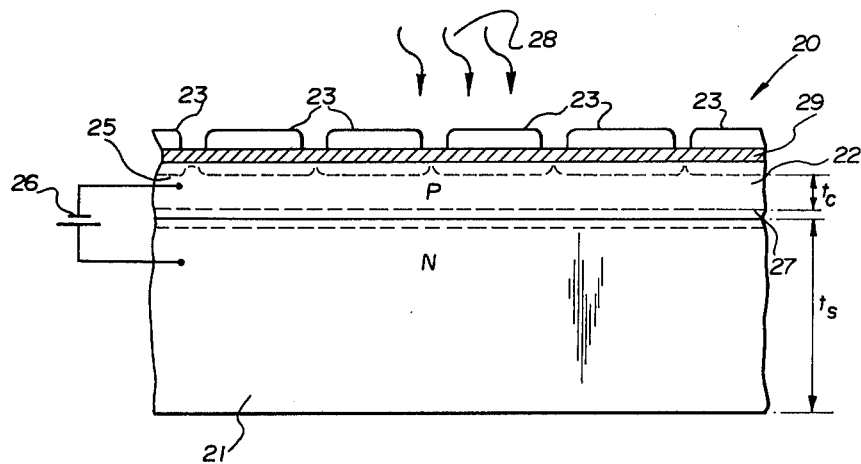
FIG. 2 illustrates a sectional view of polysilicon photogate, photoelement array with a photogeneration channel.

A similar photogeneration channel-substrate combination in accordance with this invention may be used in polysilicon photogate photoelement array 20 as shown in FIG. 2. The array 20 includes a support substrate 21 of N-doped crystalline material of thickness $t_s$ and a photogeneration channel 22 of P-doped crystalline semiconductor material, with the channel 22 reverse biased with respect to the substrate 21 by a voltage source 26. The photoelements are formed by the deposition of an insulating layer 29, such as $SiO_2$, on the photogeneration channel 22 followed by a series of spaced electrodes 23. The spaced electrodes produce potential minima on the surface of channel 22 as in other conventional gate photoelements or charge coupled devices. The thickness $t_c$ of the channel 22 between the depletion region boundary 25 of these potential minima in the boundary 27 of the depletion region in the channel 22 produced by the exterior bias 26, is the effective thickness of the channel and is smaller than the spatial modulation wavelength $d$ from which the image is formed. In particular, the optimal thickness $t_c$ is $d/\pi$, as in FIG. 1, where $d$ in this instance is the center to center spacing of the electrodes 23. In addition, as in FIG. 1, the effective thickness $t_c$ of the channel 22 may be varied by controlling the exterior bias 26.

Figure 3:
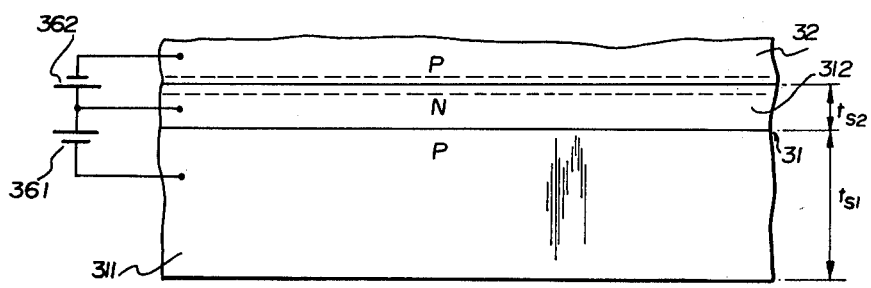
FIG. 3 illustrates a sectional view of a second embodiment of the photoelement array photogeneration channel and substrate.

In either of the photoelement arrays 10, 20 described above with respect to FIGS. 1 and 2, the support substrate 11, 21 may consist of two distinct layers as shown in FIG. 3. The support substrate 31 consists of a first layer 311 of P-doped crystalline semiconductor material having a workable thickness $t_{s1}$ which will provide for structural strength and rigidity, and a second layer of heavily N-doped crystalline semiconductor material having a thickness $t_{s2}$ which will insure adequate conductivity in the layer. In addition, layer 311 is reverse biased with respect to layer 312 by means of a voltage source 361 such that layer 311 provides electrostatic shielding for the photoelement array. Photogeneration channel 32 is deposited on the layer 312 and is also back biased with respect to layer 312 by means of a source 362, as in FIGS. 1 and 2.

Though the photogeneration channels 12, 22, and 32 in FIGS. 1, 2, and 3 respectively have been described as consisting of P-doped semiconductor material with the photogenerated carriers being electrons, these channels may be made of N-doped semiconductor material with the photogenerated carriers being holes. In this case however, substrate 11, in FIG. 1, substrate 21, in FIG. 2, and layer 312 in FIG. 3 would be P-doped semiconductor material and layer 311 in FIG. 3 would be N-doped semiconductor material. In addition, these structures for improved spatial resolution are compatible with MOSFET, CCD and bucket-brigade technologies.

The Modulation Transfer Function due to lateral diffusion, $MTF_d$, may be simulated with the solution of the two dimensional diffusion equation:

$$\frac{\delta^2 p_n}{\delta x^2} + \frac{\delta^2 p_n}{\delta y^2} - \frac{p_n - p_{no}}{L_p^2}$$

$$= \frac{-\alpha I_o \lambda}{2 hc D_\nu} T(\lambda) [1 + \cos x] e^{-\alpha y} \qquad (2)$$

where $p_n - p_{no}$ are the photogenerated minority carriers, $p_{no}$ is the equilibrium hole concentration, $L_p = \sqrt{D_p \tau_p}$, $L_p$ is the hole diffusion length at zero spatial frequencies. $D_p$ is the hole diffusion coefficient and $\tau_p$ the hole life time. The symbols carry their usual meaning. The boundary conditions are $$p_n(x,W) = 0 \qquad 3a.$$

$$p_n(x,d_1) = p_{no}. \qquad 3b.$$

The total photocurrent which is due to diffusion and due to photogeneration within the surface depletion region is given by $$J_{ph} = -q D_\nu \frac{dp_n}{dy}\bigg|_{y=W} + q \int_O^W G(x,y)\, dy, \qquad (4)$$

which yields $$J_{ph} = -q T(\lambda) \frac{I_o}{2} \frac{\lambda}{hc} [\eta_o + \eta_k \cos k\, x], \qquad (5)$$

where $$\eta_k = 1 - \frac{e^{-\alpha W}}{1 - \alpha^2 L_k^2} \left[ 1 - \alpha L_k \frac{\cosh \frac{d_{ph}}{L_k} - e^{-\alpha d_{ph}}}{\sinh \frac{d_{ph}}{L_k}} \right] \quad (6)$$

$$L_k^2 = \frac{L_p^2}{1 + L_p^2 k^2} \quad (7)$$

$$\eta_o = \eta_k \big|_{k=0} \quad 8$$

From the definition of MTF, $(MTF)_d$ is given by $$(MTF)_d = \frac{\eta_k}{\eta_o} \quad (9)$$

The highest frequency of spatial modulation which can be detected by the imager and reconstructed, is determined by the Nyquist limit; current state of the art technology offers typical Nyquist frequencies of 16.4 cycles/mm. This corresponds to a geometrical center-to-center photoelement spacing of 30μm.

Figure 4:
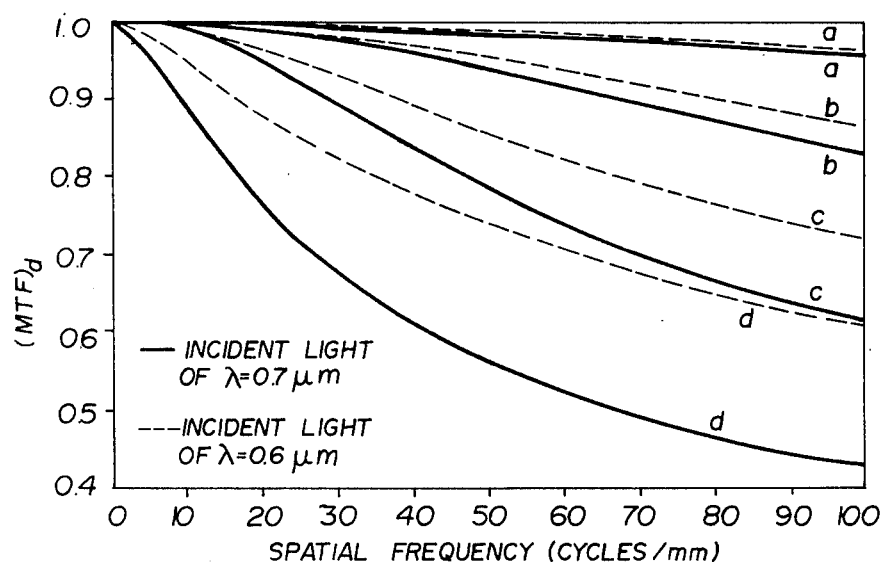
FIG. 4 illustrates the transfer function of photoelement arrays having photogeneration channels of different depths.

Using Eqn. (9), $(MTF)_d$ is calculated for a conventional CCI photoelement array; for incident visible wavelengths of 0.6μm and 0.7μm, this is shown in FIG. 4, curves $d$. An $(MTF)_d$ of 0.6 on this figure represents a center-to-center photoelement spacing of 12.5μm of 0.7μm wavelength. The roll-off of $(MTF)_d$ due to carrier lateral diffusion, for this imager, shows that no further improvement in observable resolution can be achieved even if the center-to-center spacing of the photoelements is significantly reduced below 12.5μm.

Using Egn. (9), the $(MTF)_d$ is also calculated for photoelement arrays in accordance with this invention and is shown in FIG. 4 for different photogeneration channel thicknesses $t_c$ of a 2μm-curves $a$, 4μm-curves $b$, and 9μm-curves $c$.

It is evident from these results that a photogeneration channel depth of 4μm improves $(MTF)_d$ from 0.60 to 0.94, for an incident light of 0.7μm wavelength. A similar $(MTF)_d$ improvement, which is a shift from 0.74 to 0.96, is shown for incident light in the middle of the visible spectrum with a wavelength of 0.6μm. Reduction of the depth of the photogeneration channel below 4μm the improvement in $(MTF)_d$ is small.

The quantum efficiency of the new device will be degraded by the presence and thickness $t_c$ of the photogeneration channel. Defining a collection efficiency ($\eta_o$) at zero spatial frequency, such as $$\eta_o = \frac{\text{quantum efficiency}}{T(\lambda)}$$

then $\eta_o$ is given by $$\eta_o = \frac{\alpha L_p e^{-\alpha W}}{1 - \alpha^2 L_p^2} \left[ \frac{\cosh (d_{ph}/L_p) - e^{-\alpha d_{ph}}}{\sinh (d_{ph}/L_p)} - \alpha L_p \right] + (1 - e^{-\alpha W}). \quad (10)$$

Using this equation the quantum efficiency of the photoelement arrays in accordance with this invention may be compared with that of the conventional CCIs, since the optical power transmittance $T(\lambda)$ of the $SiO_2$-poly-$SiO_2$-Si or $SiO_2$-Si layers which normally cover the photoelement, can be assumed to be the same for both devices.

Figure 5:
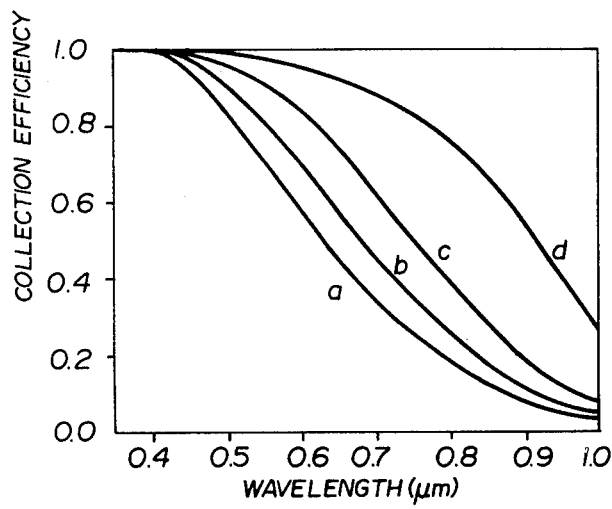
FIG. 5 illustrates the quantum efficiency of charge-coupled photoelement arrays having photogeneration channels of different depth.

In FIG. 5, the relative quantum efficiencies for a conventional CCI-curve $d$, and for photoelement arrays in accordance with this invention having a photogeneration channel effective thickness $t_c$ of 2μm-curve $a$, 4μm-curve $b$, and 9μm-curve $c$.

In a conventional CCI the collection efficiency with incident light of 0.6μm wavelength is typically 0.95. Under the same conditions the photogeneration channel device with $t_c = 4$μm, has a collection efficiency of 0.7. This 25% loss in responsivity for significant spatial resolution improvement does not impair the dynamic range of the device, since CCIs exhibit low noise characteristics. The degradation of quantum efficiency of the photogeneration channel device due to a thickness of 4μm is negligible for incident light wavelengths of less than 0.5μm. Further analysis also indicates that within the visible spectrum, a more uniform response can be obtained from a CCI which employs a photogeneration channel.

I claim:

1. A photoelement array for imaging devices comprising:

substrate means having a layer of doped semiconductor material of a first type, said substrate having a thickness $t_s$ to provide structural strength;

a photogeneration channel of doped semiconductor material of a second type located on said substrate layer for producing charged carriers in response to incident optical energy penetrating said channel;

photoelement means providing an arrangement of discrete potential minima within said photogeneration channel for collecting the charged carriers produced therein, the centers of adjacent potential minima being spaced at a distance $d$; and bias means for reverse biasing said photogeneration channel with respect to said substrate layer to produce a carrier depletion region along the adjacent channel and substrate means surfaces for draining out carriers produced by optical energy penetrating deep in the channel, wherein the effective thickness $t_c$ of the channel between the potential minima depletion region and the reverse bias depletion region is in the order of $d/\pi$.

2. A photoelement array as claimed in claim 1 wherein the photoelement means includes an arrangement of discrete regions in said channel forming p-n junction photoelements for providing the potential minima.

3. A photoelement array as claimed in claim 1 wherein the photoelement means includes a layer of insulating material located on said channel and an arrangement of spaced electrodes loated on said insulating layer for providing the potential minima on the surface of said photogeneration channel.

4. A photoelement array as claimed in claim 1 wherein said substrate means includes an additional layer of doped semiconductor material of the second type located on the surface of the substrate layer opposite said photogeneration channel, said additional layer being reverse biased with respect to said substrate layer to produce electrostatic shielding.

5. A photoelement array as claimed in claim 1 wherein said first type of semiconductor material in N-doped and said second type of semiconductor material is P-doped.

6. A photoelement array as claimed in claim 1 wherein said first type of semiconductor material is P-doped and said second type of semiconductor material is N-doped.

* * * * *